United States Patent [19]

Hart

[11] 4,141,456
[45] Feb. 27, 1979

[54] APPARATUS AND METHOD FOR ALIGNING WAFERS

[75] Inventor: Lewis F. Hart, Bridgewater, N.J.

[73] Assignee: RCA Corp., New York, N.Y.

[21] Appl. No.: 718,825

[22] Filed: Aug. 30, 1976

[51] Int. Cl.$^2$ .................................. B65G 47/90
[52] U.S. Cl. .................. 214/1 R; 214/1 BS;
 214/152; 269/21; 269/58; 294/64 R; 29/271;
 29/406; 29/743; 29/759; 219/121 L; 219/121
 LM; 219/158
[58] Field of Search ............... 214/1 R, 1 BB, 1 BT,
 214/309, 1 C, 1 Q, 152, 1 BS; 29/407, 760, 743,
 759, 740, 721, 599, 430, 468, 406, 739, 271;
 219/158, 121 L, 121 LM; 269/58-60, 21;
 279/3; 294/64 R, 64 A, 64 B

[56] References Cited

U.S. PATENT DOCUMENTS

| | | | |
|---|---|---|---|
| 3,272,350 | 9/1966 | Pflaumer et al. | 214/152 X |
| 3,611,561 | 12/1971 | Dosier | 29/759 X |
| 3,816,700 | 6/1974 | Weiner et al. | 219/121 L |
| 4,042,119 | 8/1977 | Hassan et al. | 214/1 CM |

FOREIGN PATENT DOCUMENTS 2540431  5/1976  Fed. Rep. of Germany ............ 29/407

OTHER PUBLICATIONS

Keen et al.,—"Photosensitive System For Orienting a Translucent Substrate"—Digest #21-Western Electric, Jan. 1971 —pp. 17-19.
Finu et al.—"Bernoulli Wafer Load & Unloading System"—pp. 427 and 428—vol. 16, No. 2, Jul. 1973 IBM Tech. Disc.

Primary Examiner—Frank E. Werner
Attorney, Agent, or Firm—H. Christoffersen; R. P. Williams; Sanford J. Asman

[57] ABSTRACT

The device includes an alignment station at which an operator can align a wafer under a microscope. Once the wafer is properly aligned, a transfer chuck is brought into position above the wafer and aligned with alignment pins located in fixed positions at the alignment station. The wafer is then fixed to the transfer chuck and released from the alignment station. The transfer chuck is moved into proper alignment with alignment pins at a remote operation station, such as an automatic scribing station. The invention allows the operator to view the wafer with semiconductor devices facing the operator and provides for flipping the wafer over through the use of the transfer chuck so that the laser scriber can scribe the wafer on the side away from the semiconductor devices.

11 Claims, 5 Drawing Figures

APPARATUS AND METHOD FOR ALIGNING WAFERS

BACKGROUND OF THE INVENTION

The invention relates to a device for aligning a wafer or substrate which contains microelectronic devices and circuits.

The term "scribing" is normally defined as cutting part way through a material such as a wafer or a substrate. By subsequently applying mechanical stresses to the material it can be broken along the scribed lines into individual pieces or dice.

The term "dicing" is normally defined as a cutting completely through a material such as a substrate thereby separating the material into individual dice in a single operation.

While the present invention will be described with respect to the scribing of substrates, it is to be understood that the principles and operations set forth are equally applicable to dicing of substrates and to other operations, such as photolithographic operations. Accordingly, the term "scribing" as used herein also includes the term "dicing."

The term "vacuum" is used herein to mean a pressure less than the atmospheric pressure at the place where the invention is being used. The pressure must be sufficiently reduced from atmospheric pressure to securely hold objects in the manner described herein.

It is common practice to form microelectronic circuits on substrates of semiconductor material (e.g., silicon) or dielectric material (e.g., sapphire or ceramic) separated by "streets" or "avenues." The wafers are then scribed along the "streets" and "avenues" and then fractured along the scribe lines thereby providing a rapid production means for separating circuits and devices. Such scribing is generally accomplished by diamond cutting tools, saws or laser beams.

Scribing equipment is generally automated so that a wafer is placed in the automated scribing equipment in proper alignment relative to the scribing apparatus to be guided automatically through the scribing apparatus. When a laser scriber is used, the wafer must be aligned in an initial position relative to the laser beam. Thereafter, automatic tape driven equipment will guide the wafer under the laser beam which will define scribe lines along the "streets" and "avenues." It is imperative, however, that the wafer be in proper alignment with respect to the laser beam in order that the scribe lines formed by the beam fall into "streets" and "avenues" of the wafer. Otherwise the scribe lines will cut through integrated circuits formed on the wafer and the circuits will be rendered useless.

The actual initial alignment of the substrate selected from a stack of substrates to be scribed is a relatively time-consuming operation. After each alignment has been completed the operator waits while the automatic scribing is carried out. After the scribing is completed the operator can remove the scribed wafer and insert the next wafer into the equipment and proceed with the aligning of the wafer. After that next wafer has been aligned the operator again initiates operation of the automatic scribing equipment and so forth.

In order to avoid the great loss of time required to align each wafer prior to scribing and to speed up production where it is necessary to scribe a stack of wafers, off station aligning devices such as the one described in U.S. Pat. No. 3,816,700 entitled APPARATUS FOR FACILITATING LASER SCRIBING, issued to Weiner et al on June 11, 1974, has heretofore been developed. In the device described by Weiner et al, an operator places a wafer to be scribed on a mounting plate which is held in a first holding chuck under a viewing microscope. The wafer is viewed by the operator through the microscope and is aligned with reference lines in the microscope by manually sliding the substrate beneath the microscope. After alignment, the substrate is vacuum sealed or otherwise held to the substrate mounting plate. Then the substrate mounting plate is transferred as a unit to a second holding chuck substantially identical to the first holding chuck thereby maintaining the orientation of the wafer. The second holding chuck is movable to a set position relative to a laser beam used to scribe the wafer.

It is always desirable to align the wafer with the side containing the microelectronic circuits facing the operator so that the "streets" and "avenues" may be easily seen and also to prevent damage to the microelectronic circuits which might occur if the wafer were aligned and manipulated with the side containing the microelectronic circuit facing down away from the operator and in contact with the work surface. In addition, if the wafer is aligned with microelectronic circuits facing up toward the operator it is not necessary to use a wafer which is transparent or translucent in order for the operator to be able to see the "streets" and "avenues." It is also desirable that the laser or other scribing or sawing take place on the reverse side of the wafer rather than on the side of the wafer containing formed microelectronic circuits because scribers and saws throw up debris which can contaminate the side of the wafer which is being scribed or sawed. Accordingly, apparatus of the type described by Weiner et al cannot easily be used for aligning wafers for scribing or sawing because the wafers are aligned with the same side facing the operator as will be scribed or sawed. On the other hand, apparatus of the type described herein is easily used for aligned wafers for sawing and scribing because the wafers are flipped over following alignment and prior to sawing or scribing. Therefore, wafers may be aligned with the microelectronic circuits facing the operator and then scribed or sawed on the reverse side of the wafer preventing contamination of the microelectronic circuits.

DESCRIPTION OF THE PREFERRED EMBODIMENT

Figure 1:
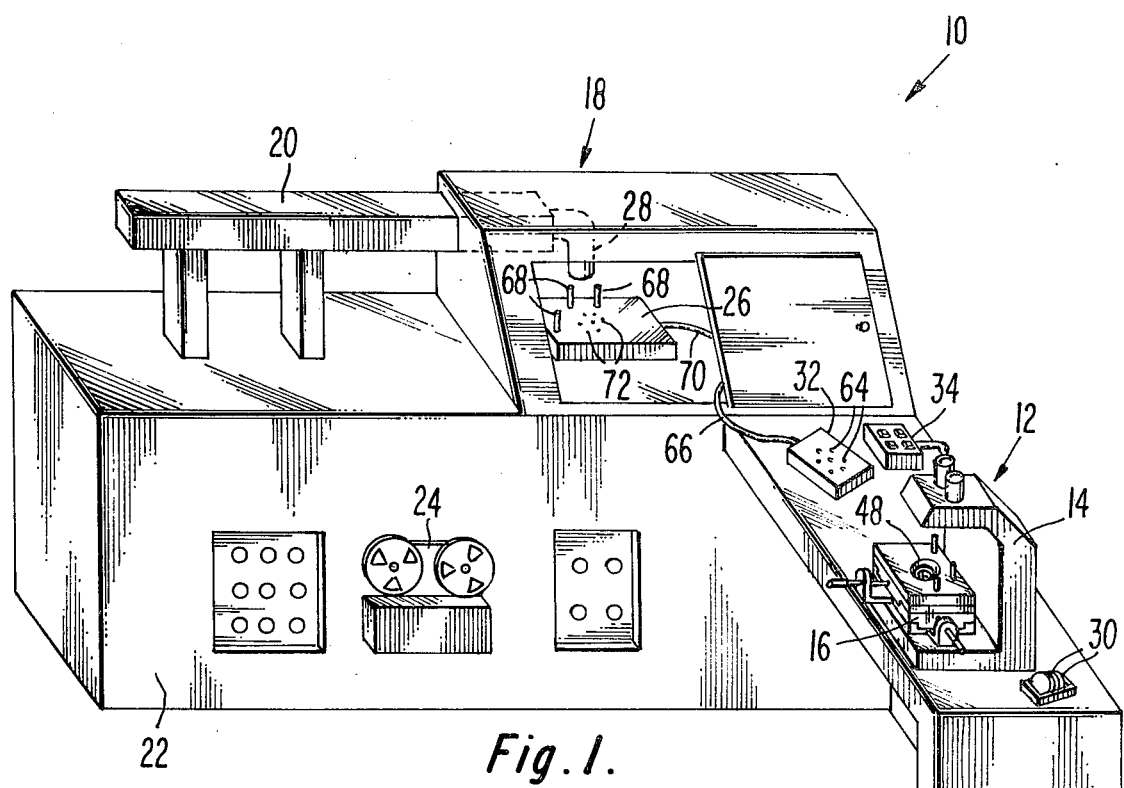
FIG. 1 is a perspective view of a work station including an alignment station and a laser scribing station.

Referring now to FIG. 1, a work station area 10 for a single operator is shown. In the area 10 there is located a wafer alignment station 12 which includes a viewing microscope 14 having a compound 16 thereon. Adjacent to the alignment station 12 is a remote operation station, in this case a laser scribing station 18 which includes a suitable laser 20 together with an enclosure 22 which contains a power supply and electronics to operate the laser 20 and a tape drive apparatus 24 capable of driving an automatic table assembly 26 which is positioned under optics 28 associated with the laser 20. The automatic equipment within the enclosure 22 is programmed to move the table assembly 26 which holds the wafer in a manner which will be described hereinafter from an initial set position along a path determined by the information contained on the tapes held by the tape drive 24. The movement of the table assembly 26 will be such that the laser beam projected down onto a wafer from the optics 28 will scribe a path which follows the "streets" and "avenues" on the wafer in an automatic manner once the equipment is started.

A number of wafers 30 adjacent the alignment station 12 are shown preparatory to being scribed in accordance with the present invention. Also shown in FIG. 1 is a transfer chuck 32 and a vacuum control panel 34 which will each be described hereinafter.

Figure 2:
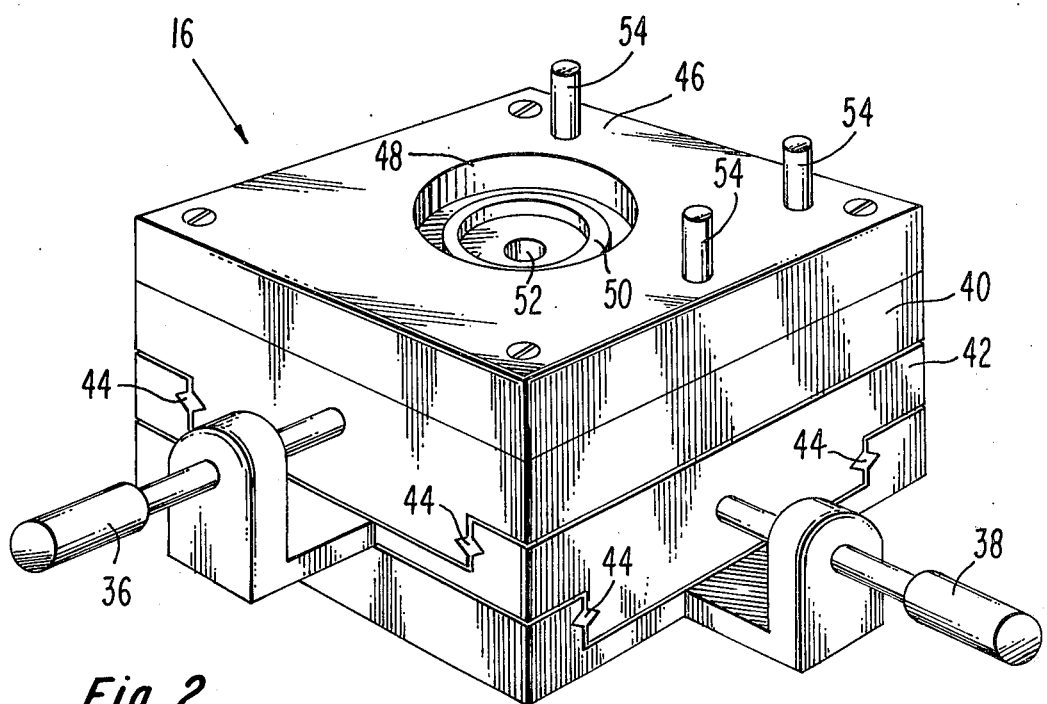
FIG. 2 is a perspective view showing a close up of a compound used at the alignment station.

Referring now to FIG. 2, the compound 16 is shown in greater detail. The compound 16 may be moved by the operator in the x or y direction by turning vernier apparatus 36, 38 to move portions of the compound 40, 42 respectively which are on movable tracks and are spring biased against the vernier apparatus. The movable tracks contain bearings which are located in slots 44 to provide smooth movement of the portions of the compound 16. A substantially flat plate 46 is attached to the uppermost portion 40 of the compound 16. The plate 46 has a substantially recessed portion 48 formed therein. At the bottom of the recessed portion 48 there is a gasket 50 which surrounds a vacuum line opening 52. The opening 52 is connected to a vacuum line through a valve (not shown) which is controlled by the operator with appropriate switches on the vacuum control. panel 34. Three alignment pins 54 are mounted on the plate 46.

Figure 3:
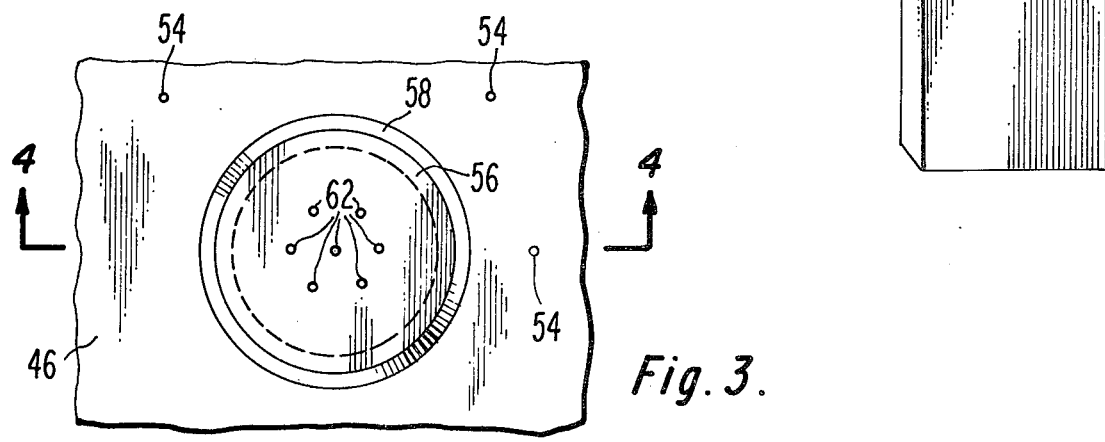
FIG. 3 is a top view of a wafer holder mounted on the compound.
Figure 4:
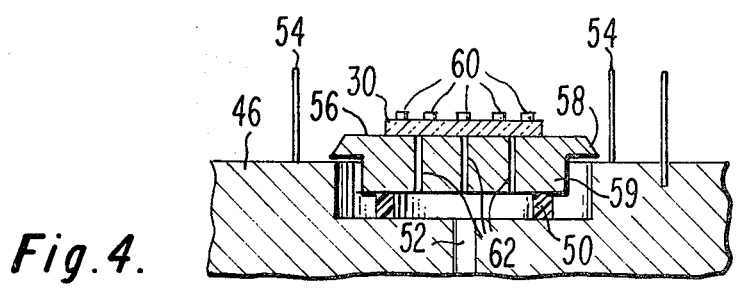
FIG. 4 is a cross-sectional view of the wafer holder and upper portion of the compound of FIG. 3 taken along the lines 4—4 of FIG. 3 and includes also a cross-sectional view of a wafer mounted on the wafer holder.

Referring now to FIGS. 3 and 4, a wafer holder 56 is shown mounted on the surface 46 of the compound 16. The wafer holder 56 contains a bevelled edge 58 which is used by the operator to move the holder 56 over the surface of the gasket 50 without the operator having to touch a wafer 30 which is placed on the surface of the holder 56. The wafer 30 is placed on the holder 56 with its microelectronic circuits, diagrammatically shown at 60, facing up toward the operator. Extending through the wafer holder 56 there is a series of holes 62 which are used to enable the operator to hold the wafer 30 against the holder 56 by controlling the vacuum present at the opening 52.

The wafer holder 56 has a cylindrical lower portion 59 which extends into the recessed portion 48 of the compound 16. The cylindrical portion 59 of the wafer holder 56 has a smaller diameter than the cylindrical recessed portion 48 of the compound 16. Therefore, the operator has quite a bit of leeway in positioning the wafer 30 under the cross hairs of the microscope 14 and he can do so simply by moving the wafer holder 56 within the recessed portion 48 of the plate 46. Accordingly, the x and y adjustments to the compound 16 are locked when wafer alignment is taking place and are generally used only when it is necessary to align the cross hairs of the microscope 14 with respect to a target wafer, as will be described hereinafter.

The operator views the wafer 30 through the microscope 14 and aligns "streets" and "avenues" between the microelectronic circuits 60 with the cross hair indicia in the microscope 14. A cross hair indicium having a long length and situated along a "street" will cross more "avenues" than an indicium having a short length. Similarly, a cross hair indicium having a long length and situated along an "avenue" will cross more "streets" than an indicium having a short length. Naturally, the more "streets" and "avenues" which the cross hair indicia are able to cross, the more accurate the alignment of a particular wafer will be because any small angular difference between the cross hair indicia and the direction of the "streets" and "avenues" can result in the destruction of microelectronic circuits which are disposed away from the intersection which is used for alignment. Such destruction will result when the wafer is scribed if the alignment does not follow the "streets" and "avenues." In order to alleviate this problem, a split image microscope having two eyepieces and two sets of cross hair indicia, each of which is superimposed upon different, isolated portions of the wafer 30 is used. A split image microscope has the effect of creating a very long length cross hair indicium without the necessity of reducing the magnification of the microelectronic circuits 60. Thus, a split image microscope maintains high magnification while allowing the operator to view isolated portions of the wafer 30 thereby allowing the operator to insure that the "streets" and "avenues" between the microelectronic circuit 60 of the wafer 30 are not skewed with respect to the cross hair indicia of the microscope. Once the wafer is in proper alignment, the operator pushes the appropriate button on the vacuum control panel 34 to apply full vacuum to the vacuum line 52 thereby fixing the wafer 30 and the holder 56 in position on the gasket 50.

Figure 5:
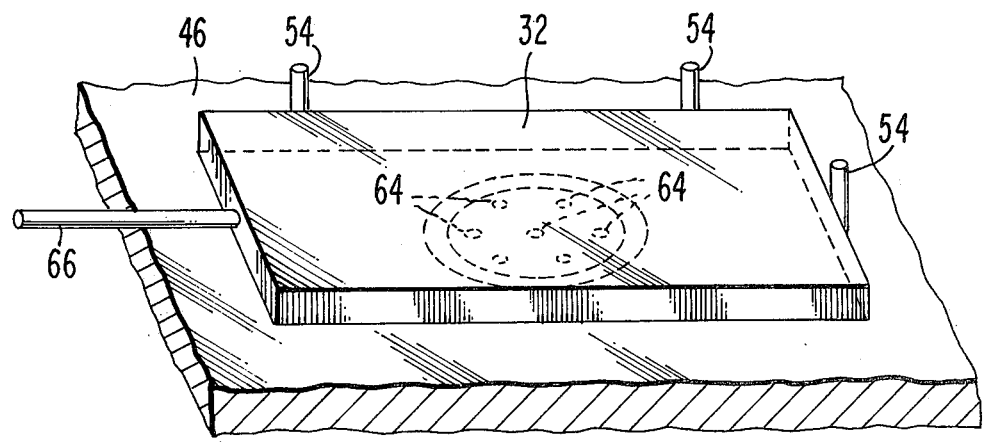
FIG. 5 is a perspective view of the compound of FIG. 2 showing a transfer chuck in position on the compound.

The transfer chuck 32, which in the preferred embodiment of the invention is a substantially rectangular body having a series of holes 64 formed therein and a flexible vacuum line 66 attached thereto, is next brought into position and aligned with the alignment pins 54 and lowered onto the wafer 30 with the holes facing down, as shown in FIG. 5. The operator then pushes the appropriate button on the vacuum control panel 34 to apply full vacuum to the transfer chuck 32. Following application of full vacuum to the transfer chuck 32, the operator pushes the appropriate button on the control panel 34 to release vacuum from the line 52 thereby allowing the wafer 30 to be withdrawn from the holder 56 and allowing the transfer chuck 32 to be lifted with the wafer 30 from the compound 16.

Next, the transfer chuck 32 is removed from the alignment station 12 with the wafer 30 attached and is flipped over and placed in alignment with a set of alignment pins 68 which are fixed to the table assembly 26 shown in FIG. 1. When the transfer chuck 32 is so positioned, it is lowered onto the table assembly 26 and vacuum is applied to a vacuum line 70 which causes reduced pressure through holes 72 on the table assembly 26 to fix the wafer 30 and transfer chuck 32 in position on the table assembly 26 with the rear side of the wafer 30, i.e. the side without circuitry, facing upward toward the laser optics 28.

For reasons which will be explained hereinafter it is not necessary for the alignment pins 68 on the table assembly 26 to have the same relative positions as the alignment pins 54 on the plate 46 on the compound 16.

Once the transfer chuck 32 with the wafer 30 thereon has been fixed into position on the table assembly 26, the automatic equipment in the scriber 18 is turned on. The laser is turned on, and the table assembly 26 moves under the laser beam and scribes lines on the rear side of the wafer 30 opposite the "streets" and "avenues" between the microelectronic circuits 60. The scribing of the "streets" and "avenues" on the rear side of the wafer 30 is carried out automatically without need for operator intervention. Accordingly, the operator may be aligning the next wafer at the alignment station 12 while the first wafer 30 is being scribed.

Now that the operation of the invention has been described, the manner in which the alignment of the cross hairs of the microscope 14 is accomplished will be described. In order to align the cross hairs, a defective wafer or a dummy, called a target, which must be translucent or transparent, is mounted on the transfer chuck 32 which is then placed on the table assembly 26 in contact with the alignment pins 68. The scriber 18 is used to scribe a reference cross on the target. The transfer chuck 32 with the target attached is then moved to the alignment station 12 where the target containing the scribed reference lines is transferred from the transfer chuck 32 onto the wafer holder 56 while the transfer chuck is in contact with the alignment pins 54. A vacuum is applied to the vacuum line 52 to hold the target on the holder 56, and then the vacuum on the vacuum line 66 of the transfer chuck 32 is removed. The transfer chuck is then removed from the target which will be fixed in position on the wafer holder 56 with the scribed reference lines on its bottom surface. Using a strong light source adjacent to the target the reference lines will be visible to an operator viewing through the microscope 14 and he will be able to align the cross hairs in the microscope 14 with the reference lines on the target. In order to accomplish the alignment, the operator may adjust the x and y positions of the compound 16 as well as the microscope's cross hairs. Once the cross hairs of the microscope 14 have been aligned to the reference lines on the target all future wafers which are to be aligned will be viewed with the microelectronic circuits 62 face up, thereby facilitating wafer alignment.

In view of the fact that the alignment pins 54 always hold the transfer chuck 32 in a fixed position on the compound 16 and the alignment pins 68 always hold the transfer chuck 32 in a fixed position on the table assembly 26, the cross hair aligning process described above will properly align the cross hair indicia with respect to the target despite the fact that the alignment pins 68 are not in the same relative position as the alignment pins 54. It is only necessary that a set of alignment pins always hold the transfer chuck 32 in the same position at a given station. Accordingly, the present invention avoids the requirement of some of the devices used heretofore that the holders at each station be accurately machined to be the same as the holders at other stations.

While the present invention has been described with reference to a single operator, it should be obvious that a second operator can also use a second microscope for aligning wafers in the event that one operator is unable to align wafers as quickly as the scriber 18 is able to scribe the wafers. An additional advantage, however, of the present invention is that a second transfer chuck 32 may be employed to further speed up the process by always having a transfer chuck loaded with a wafer ready to be transferred onto the table assembly 26 upon completion of the scribing of a wafer. In such event, a second microscope would have its cross hairs aligned in the manner described above for use with the second transfer chuck. It will not be necessary for the alignment pins on the compound of the second microscope to have the same alignment as the alignment pins 54 on the compound of the first microscope 14 or the alignment pins 68 on the table assembly 26 for the reasons described above.

It will also not be necessary for the second transfer chuck to be machined to be identical to the first transfer chuck 32. Accordingly, a significant decrease in the expense associated with the manufacture of table assemblies 26, transfer chucks 32 and compound 16 may be achieved by using the present invention relative to devices heretofore known.

While the present invention has been described with reference to a laser scriber 18 as the remote operation station, it should be recognized that the remote operation station for which alignment is required can be something other than a laser scriber, such as a diamond scriber, a saw, a milling machine or another operation which requires alignment of wafers or similar objects. In these latter cases, the advantages of being able to align while viewing the microelectronic circuits and then being able to flip the wafer over to perform the operation can be significant, especially in situations where the wafers are opaque.

I claim:
1. An apparatus for aligning wafers comprising:
   (a) an alignment station including means for contacting and selectively holding a wafer in a fixed position;
   (b) a transfer chuck including means for contacting and selectively holding said wafer in a fixed position, said transfer chuck being separate and distinct from said alignment station;
   (c) means associated with said alignment station for receiving said transfer chuck in a predetermined orientation;
   (d) a microscope located in a fixed position relative to said alignment station in order that an operator will view and then align a wafer positioned at said alignment station relative to reference lines in said microscope; and
   (e) a remote operation station including means for contacting and selectively holding said wafer in a fixed position as well as means for receiving said transfer chuck in a predetermined orientation.

2. The apparatus of claim 1 in which said means for selectively holding a wafer at said alignment station comprises a compound capable of moving said wafer in the x and y directions.

3. The apparatus of claim 2 further comprising a wafer holder which fits into said compound and which may be rotated or removed in any direction on said compound.

4. The apparatus of claim 3 in which said wafer holder has a bevelled edge to facilitate movement by said operator.

5. The apparatus of claim 1 wherein said means for selectively holding a wafer includes means for selectively subjecting said wafer to a pressure less than atmospheric pressure whereby said wafer is held in a fixed position by atmospheric pressure.

6. The apparatus of claim 1 wherein said means for selectively holding said wafer included in said transfer chuck comprises means for subjecting said wafer to a pressure less than atmospheric pressure whereby said wafer will be held in a fixed position on said transfer chuck by atmospheric pressure.

7. The apparatus of claim 1 wherein said means associated with said alignment station for receiving said transfer chuck comprises a set of alignment pins which contact the edges of said transfer chuck.

8. The apparatus of claim 1 wherein said means for selectively holding said wafer at said remote operation station comprises means for subjecting said wafer to a pressure less than atmospheric pressure whereby said wafer will be held in a fixed position by atmospheric pressure.

9. The apparatus of claim 1 wherein said means for receiving said transfer chuck at said remote operation station includes alignment pins which contact the edge of said transfer chuck in a predetermined orientation of said transfer chuck.

10. The apparatus of claim 1 wherein said microscope is a split image microscope.

11. A method of aligning a wafer comprising the steps of:
   (a) placing a wafer onto means for selectively holding said wafer at an alignment station where it can be viewed by an operator through a microscope having alignment indicia therein;
   (b) adjusting the position of said means for selectively holding said wafer to cause selected portions of said wafer to coincide with said indicia;
   (c) fixing the position of said means for selectively holding said wafer at said alignment station;
   (d) moving a transfer chuck into position over said wafer and in contact with alignment pins in fixed positions relative to said wafer;
   (e) lowering said transfer chuck onto said wafer while keeping said transfer chuck in contact with said alignment pins;
   (f) attaching said transfer chuck to said wafer;
   (g) releasing said wafer from said means for selectively holding said wafer at said alignment station;
   (h) moving said transfer chuck into position at a remote operation station and in contact with a set of alignment pins;
   (i) lowering said transfer chuck into position at a remote operation station while keeping said transfer chuck in contact with said alignment pins;
   (j) attaching said transfer chuck to said remote operation station.

* * * * *